(12) United States Patent
Moriya et al.

(10) Patent No.: US 7,347,006 B2
(45) Date of Patent: Mar. 25, 2008

(54) PROCESSING APPARATUS AND METHOD FOR REMOVING PARTICLES THEREFROM

(75) Inventors: Tsuyoshi Moriya, Nirasaki (JP); Hiroshi Nagaike, Nirasaki (JP); Hiroyuki Nakayama, Nirasaki (JP); Kikuo Okuyama, Higashihiroshima (JP); Manabu Shimada, Higashihiroshima (JP)

(73) Assignee: Tokyo Electron Limited, Tokyo (JP)

( * ) Notice: Subject to any disclaimer, the term of this patent is extended or adjusted under 35 U.S.C. 154(b) by 243 days.

(21) Appl. No.: 11/065,359

(22) Filed: Feb. 25, 2005

(65) Prior Publication Data

US 2005/0189071 A1    Sep. 1, 2005

(30) Foreign Application Priority Data

Feb. 26, 2004  (JP) .............................. 2004-051706

(51) Int. Cl.
*F26B 5/04* (2006.01)
(52) U.S. Cl. ............................ 34/403; 34/406; 34/476; 34/493; 34/497; 34/92
(58) Field of Classification Search ................ 34/402, 34/403, 406, 476, 493, 497, 92; 156/345.27, 156/345.24, 345.1; 216/59; 118/718, 724, 118/725; 96/221

(56) References Cited

U.S. PATENT DOCUMENTS 4,816,046 A * 3/1989 Maeba et al. ................ 96/221
6,811,651 B2 * 11/2004 Long ..................... 156/345.27

FOREIGN PATENT DOCUMENTS

JP         3-147317         6/1991

* cited by examiner

*Primary Examiner*—Kenneth Rinehart
(74) *Attorney, Agent, or Firm*—Oblon, Spivak, McClelland, Maier & Neustadt, P.C.

(57) ABSTRACT

A processing apparatus includes a first detection unit for detecting a temperature of an inner wall of the vacuum vessel, a second detection unit for detecting a temperature of the processing unit, and a first control unit for controlling a temperature of the gas. The first control unit controls the temperature of the gas based on a temperature gradient between the temperatures of the inner wall and the gas or a temperature gradient between the temperatures of the processing unit and the gas. A method for removing particles from a processing apparatus includes a first detection step for detecting a temperature of an inner wall of the vacuum vessel, a second detection step for detecting a temperature of the processing unit, a first control step for controlling a temperature of the gas, and a gas introduction step for introducing the gas into the inner space of the vacuum vessel.

6 Claims, 4 Drawing Sheets

PROCESSING APPARATUS AND METHOD FOR REMOVING PARTICLES THEREFROM

FIELD OF THE INVENTION

The present invention relates to a processing apparatus and a method for removing particles from the processing apparatus; and, more particularly, to a processing apparatus for removing particles floating in a vacuum vessel thereof, and a method therefor.

BACKGROUND OF THE INVENTION

Conventionally, in a fabrication of a device, a liquid crystal or the like, there has been a problem that an object to be processed is contaminated due to particles produced in the fabrication process thereof. Therefore, reduction of the particles has been required.

For example, as described in FIG. 5, a dry etching device, which is a processing apparatus for an object to be processed, includes a vacuum processing chamber 10 whose inside is maintained at a high vacuum to perform an etching process on a wafer 50 of an object to be processed; a lower electrode 20, disposed at a lower portion of the vacuum processing chamber 10, that also serves as a mounting table for mounting thereon the wafer 50; an upper electrode 40 disposed opposite to the lower electrode 20 in the vacuum processing chamber 10; and a heat exchanger 15 provided at an inner wall of the vacuum processing chamber 10. The lower electrode 20 is connected to a high frequency power supply 25 through a blocking capacitor 22 and a high frequency matching circuit 21; and the upper electrode 40 has gas injection openings 42 for injecting a gas transferred from a gas feeding unit 41, which supplies a specific gas. Further, at the vacuum processing chamber 10, there are provided an gas introduction line 80 for introducing a gas thereinto; a vacuum exhaust port 12 connected to an exhaust means (not shown); and a pressure gauge 13 for measuring a pressure in the vacuum processing chamber 10 through a pressure gauge port 14.

In the aforementioned dry etching device, the vacuum processing chamber 10 is evacuatable by the exhaust means (not shown), and at the same time, a liquid or a gas is introduced into the vacuum processing chamber 10 through the gas introduction line 80. The introduced liquid or gas is cooled by adiabatic expansion, and is solidified or liquefied using a particle floating in the vacuum processing chamber 10 as a core, to fall to the lower portion of the vacuum processing chamber 10. The particles grown with the solidification or the liquefaction adhere on the wafer 50, resulting in defects of etching or film formation.

Further, by recent studies on generation of contamination of an object to be processed due to particles, it has been known that particles, adhered on the inner wall of the processing chamber or the like in the processing apparatus for use in the manufacturing process of the object, peel off to adhere on the object, resulting in the contamination thereof. Moreover, it has been also known that if the inner wall of the processing chamber is heated to the temperature of 40° C. to 50° C. and an etching process is performed on the object, a large number of particles are generated inside the processing chamber, resulting in the contamination of the object (see, e.g., U.S. Pat. No. 6,024,105).

However, the problematic point is that a mechanism of contamination of an object to be processed due to the particles in the processing apparatus has not been studied enough to reduce the contamination of the object due to the particles.

SUMMARY OF THE INVENTION

It is, therefore, an object of the present invention to provide a processing apparatus capable of reducing contamination of an object to be processed due to the particles and a method for removing the particles therefrom.

For achieving the object, in accordance with one aspect of the present invention, there is provided a processing apparatus having a vacuum vessel whose inner space is evacuatable; a gas introduction unit for introducing a gas into the inner space of the vacuum vessel; and a processing unit, disposed in the inner space of the vacuum vessel, for processing an object therein, the processing apparatus including: a first detection unit for detecting a temperature of an inner wall of the vacuum vessel; a second detection unit for detecting a temperature of the processing unit; and a first control unit for controlling a temperature of the gas, wherein the first control unit controls the temperature of the gas based on a temperature gradient between the temperatures of the inner wall and the gas or a temperature gradient between the temperatures of the processing unit and the gas.

Further, in the processing apparatus in accordance with the present invention, the first control unit may control the temperature of the gas to a temperature lower than at least one of the temperatures of the inner wall and the processing unit, by 30° C. or more.

Still further, the processing apparatus may further include a first heating unit for heating the inner wall of the vacuum vessel.

Still further, in the processing apparatus, the processing unit may contains: a lower electrode, disposed at a lower portion of the vacuum vessel, for mounting thereon the object to serve as a mounting table; an upper electrode disposed opposite to the lower electrode in the vacuum vessel; a first temperature control unit for maintaining the lower electrode at a first temperature; and a second temperature control unit for maintaining the upper electrode at a second temperature.

Still further, the processing apparatus may include a second control unit for controlling a pressure of the inner space of the vacuum vessel.

Still further, in the processing apparatus, the pressure of the inner space of the vacuum vessel may be controlled by the second control unit in the range of 1.0~10 Torr (0.13~1.3 Pa).

In accordance with another aspect of the present invention, there is provided a method for removing particles from a processing apparatus having a vacuum vessel whose inner space is evacuatable; a gas introduction unit for introducing a gas into the inner space of the vacuum vessel; and a processing unit, disposed in the inner space of the vacuum vessel, for processing an object therein, the method including: a first detection step for detecting a temperature of an inner wall of the vacuum vessel; a second detection step for detecting a temperature of the processing unit; a first control step for controlling a temperature of the gas; and a gas introduction step for introducing the gas into the inner space of the vacuum vessel, wherein, in the first control step, the temperature of the gas is controlled based on a temperature gradient between the temperatures of the inner wall and the gas or a temperature gradient between the temperatures of the processing unit and the gas.

Further, in the first control step of the method, the temperature of the gas may be controlled to a temperature lower than at least one of the temperatures of the inner wall and the processing unit, by 30° C. or more.

Still further, the method in accordance with the present invention may further include a first heating step for heating the inner wall of the vacuum vessel.

Still further, in the method in accordance with the present invention, the processing unit may contain: a lower electrode, disposed at a lower portion of the vacuum vessel, for mounting thereon the object to serve as a mounting table; and an upper electrode disposed opposite to the lower electrode in the vacuum vessel, and the method may further include: a first temperature control step for maintaining the lower electrode at a first temperature; and a second temperature control step for maintaining the upper electrode at a second temperature.

Still further, the method may include a second control step for controlling a pressure of the inner space of the vacuum vessel.

Still further, in the second control step of the method, the pressure of the inner space of the vacuum vessel may be controlled in the range of 1.0~10 Torr (0.13~1.3 Pa).

Still further, in the gas introduction step of the method, the gas may be introduced in the inner space of the vacuum vessel before the object is processed by the processing unit.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

Figure 1:
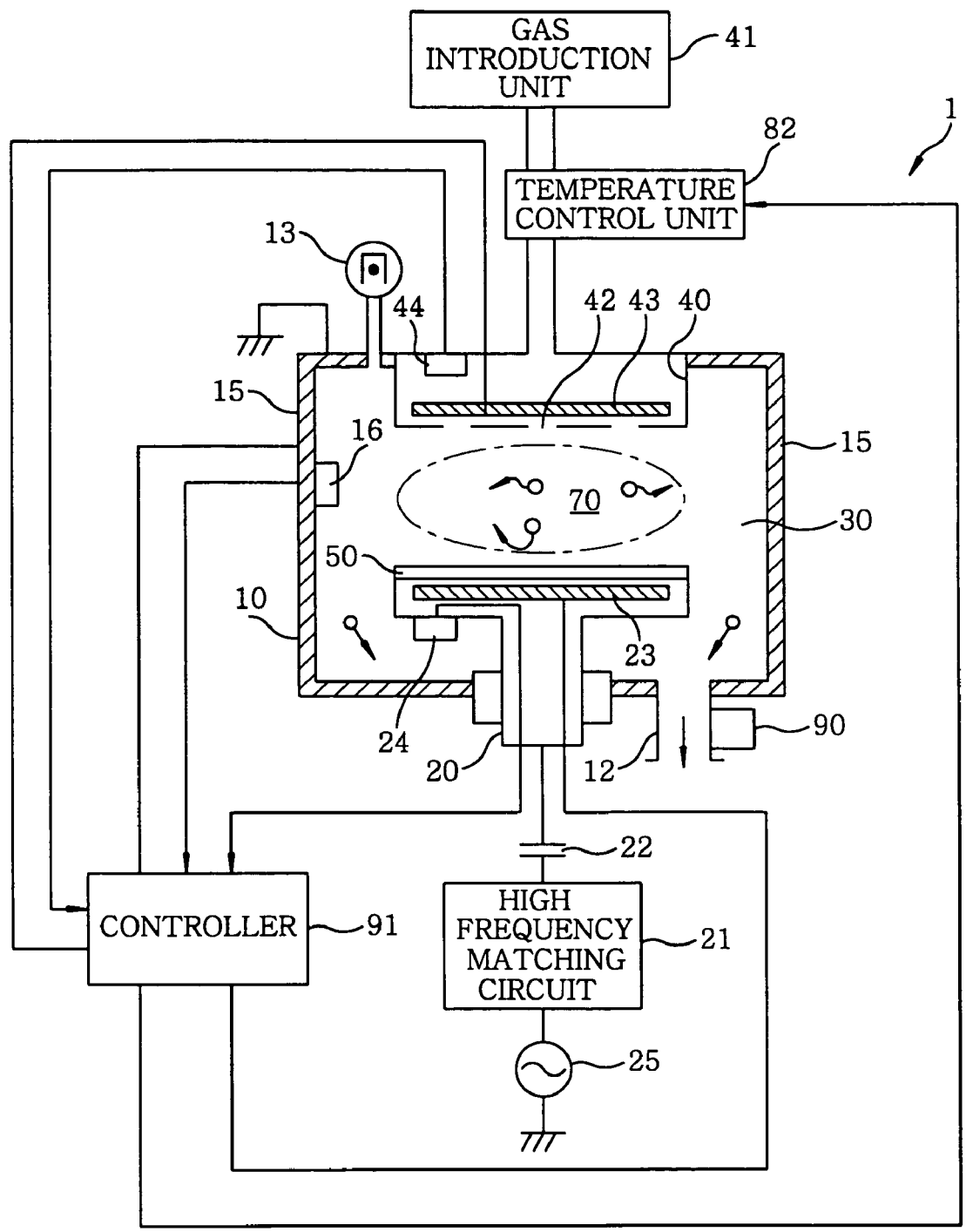
FIG. 1 offers a cross sectional view for showing a schematic configuration of a processing apparatus in accordance with a preferred embodiment of the present invention.

FIG. 1 is a cross sectional view for showing a schematic configuration of a processing apparatus in accordance with a preferred embodiment of the present invention.

As described in FIG. 1, a dry etching device 1, which is a processing apparatus, includes a vacuum processing chamber 10 whose inside is maintained at a high vacuum state to perform an etching process on a wafer 50 as an object to be processed, an inner wall thereof being made of aluminum; a lower electrode 20, disposed at a lower portion of the vacuum processing chamber 10, for mounting thereon the wafer 50 to serve as a mounting table; an upper electrode 40 disposed opposite to the lower electrode 20 in the vacuum processing chamber 10; a heating unit 15, such as a heat exchanger or the like, for heating the inner wall of the vacuum processing chamber 10; and a temperature sensor 16 for detecting the temperature of the inner wall of the vacuum processing chamber 10. The lower electrode 20 contains a temperature control unit 23, such as a heat exchanger or the like, for maintaining the lower electrode 20 at a first temperature, and a temperature sensor 24 for detecting a temperature of the lower electrode 20. The upper electrode 40 contains a temperature control unit 43, such as a heat exchanger or the like, for maintaining the upper electrode 40 at a second temperature, and a temperature sensor 44 for detecting a temperature of the upper electrode 40.

The lower electrode 20 is connected to a high frequency power supply 25 through a blocking capacitor 22 and a high frequency matching circuit 21. And, the upper electrode 40 has introduction ports 42 through which a predetermined gas is introduced into the vacuum processing chamber 10.

At the lower portion of the vacuum processing chamber 10, there is installed a vacuum exhaust port 12 connected to an exhaust means (not shown). And, at the upper portion of the vacuum processing chamber 10, there is installed a pressure gauge 13 for measuring a pressure in the vacuum processing chamber 10.

Further, the dry etching device 1 includes a gas introduction unit 41, connected to the upper electrode 40, for introducing the predetermined gas into the vacuum processing chamber 10; a temperature adjusting unit 82, connected to the upper electrode 40 and the gas introduction unit 41, for adjusting a temperature of the gas to be introduced into the vacuum processing chamber 10 by heating or cooling the gas; and a pressure control unit 90 for controlling the pressure in the vacuum processing chamber 10.

Still further, the dry etching device 1 includes a controller 91 for controlling the temperature of the gas, based on a temperature of any one of the inner wall of the vacuum processing chamber 10, the lower electrode 20 and the upper electrode 40. The controller 91 controls the temperature of the gas to be introduced into the vacuum processing chamber 10 by inputting a signal from any one of the temperature sensor 16 for detecting the temperature of the inner wall of the vacuum processing chamber 10, the temperature sensor 24 for detecting the temperature of the lower electrode 20 and the temperature sensor 44 for detecting the temperature of the upper electrode 40; setting a temperature of the gas based on the inputted signal; and outputting a signal corresponding to the set temperature to the temperature adjusting unit 82 to adjust the temperature of the gas.

To be specific, the controller 91 controls the temperature of the gas to be introduced into the vacuum processing chamber 10 to a level lower by 30° C. or more than any one of the temperatures of the inner wall of the vacuum processing chamber 10, the lower electrode 20 and the upper electrode 40. Namely, the controller 91 controls the temperature of the gas based on any one of temperature gradients due to temperature differences between the gas and the inner wall of the vacuum processing chamber 10, between the gas and the lower electrode 20 and between the gas and the upper electrode 40.

Generally, with regard to the dry etching device 1, the temperatures of the inner wall of the vacuum processing chamber 10, the lower electrode 20 and the upper electrode 40 are set at 80° C., 0° C. and 50° C., respectively. For example, in case of removing particles adhered to the inner wall of the vacuum processing chamber 10, the gas introduced into the vacuum processing chamber 10 is controlled to have a temperature lower by 30° C. or more than that of the inner wall, i.e., lower than 50° C.

Figure 2:
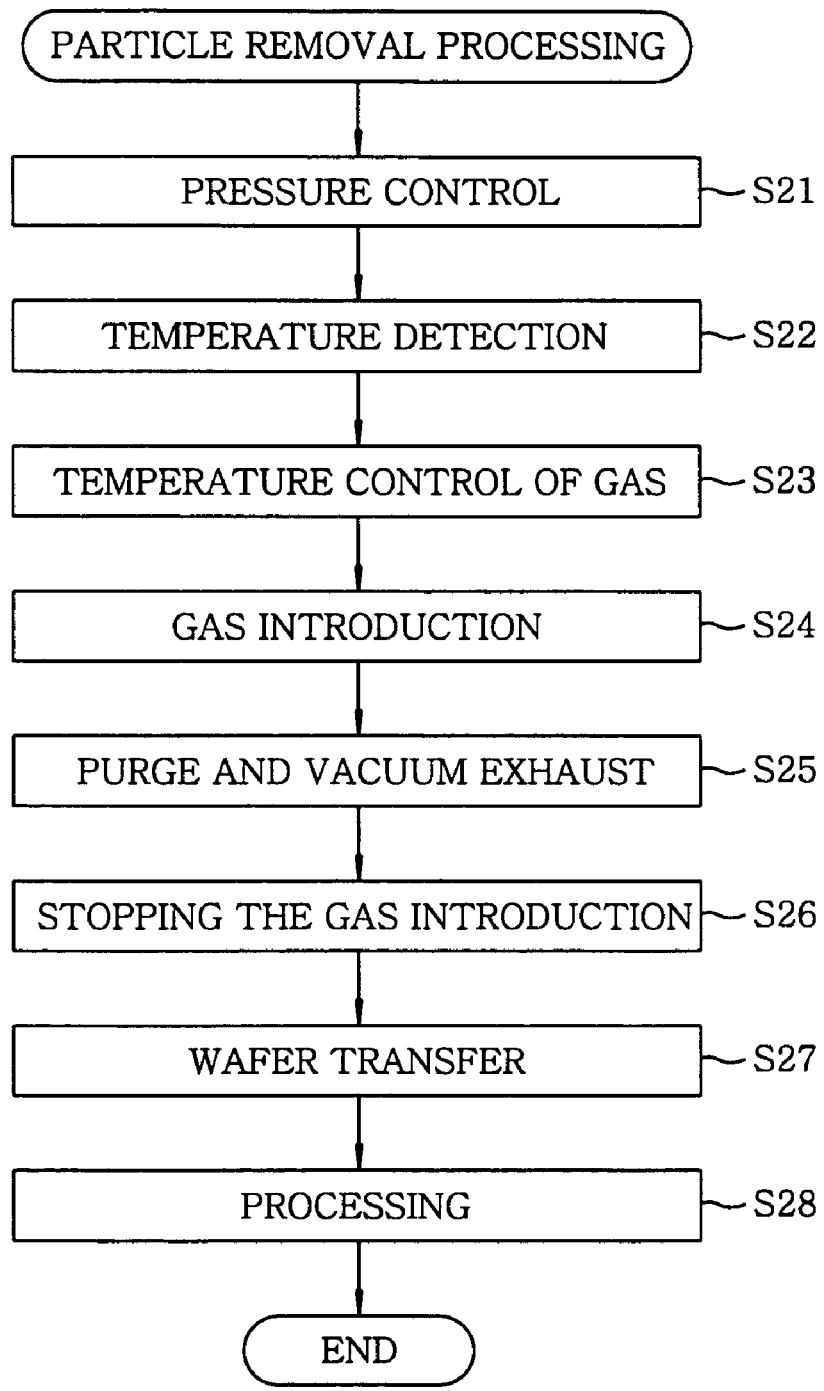
FIG. 2 provides a flowchart showing a method for removing particles from the processing apparatus in accordance with the preferred embodiment of the present invention.

FIG. 2 is a flowchart showing a method for removing particles from the processing apparatus in accordance with the preferred embodiment of the present invention. Further, in the present embodiment, a method for removing particles adhered to the inner wall of the vacuum processing chamber of the processing apparatus will be shown as an example.

As described in FIG. 2, first, the pressure in the vacuum processing chamber 10 of the dry etching device 1 as the processing apparatus is controlled at a fixed level (about 5.0 Torr) (step S21), and the temperature of the inner wall of the vacuum processing chamber 10 is detected (step S22).

After that, the temperature of the gas introduced into the vacuum processing chamber 10 is controlled to a temperature lower by 30° C. or more than that of the inner wall of the vacuum processing chamber 10 (step S23).

Subsequently, the temperature controlled gas is introduced into the vacuum processing chamber 10 (step S24), and the inside of the vacuum processing chamber 10 is purged with the temperature controlled gas for a while by evacuating the gas therefrom (step S25). After that, the introduction of the gas into the vacuum processing chamber 10 is stopped (step S26); the wafer 50 as the object to be processed is loaded into the vacuum processing chamber 10 (step S27); and a predetermined processing is performed on the wafer 50 by using the lower and the upper electrode 20 and 40 to complete the processing (step S28). As mentioned above, the gas is introduced into the vacuum processing chamber 10 (step S24) and the inside of the vacuum processing chamber 10 is purged with the temperature controlled gas by evacuating the gas therefrom (step S25), before the predetermined processing is performed on the wafer 50 by using the lower and the upper electrode 20 and 40 (step S28). Therefore, the particles adhered to the inner wall of the vacuum processing chamber 10 are peeled off therefrom by a thermophoretic force, which is generated due to the temperature gradient between the inner wall of the vacuum processing chamber 10 and the temperature controlled gas, and thus contamination of the wafer 50 due to the particles can be securely reduced.

In the present embodiment, although the method for removing particles adhered to the inner wall of the vacuum processing apparatus 10 has been described, the present invention is not limited thereto. It may be possible to detect a temperature of any one part, where the particles should be removed, among the inner wall of the vacuum processing apparatus 10, the lower electrode 20 and the upper electrode 40; and control the temperature of the gas based on the temperature gradient between the detected temperature and that of the gas.

Here, a temperature difference $\Delta T$ between the temperature of the gas and that of the inner wall of the vacuum processing chamber 10 is determined based on linear expansion coefficients of an inner wall material of the vacuum processing chamber 10 and particles acting as sources of contamination of the wafer 50. Assuming that the linear expansion coefficients of particles are constant, $\Delta T$ depends on the linear expansion coefficient of the inner wall material of the vacuum processing chamber 10.

In the following, there will be discussed a relationship between the number of particles scattered from the wafer 50 into the inner space of the vacuum processing chamber 10, and the temperature difference $\Delta T$ between the gas to be introduced into the vacuum processing chamber 10 and the inner wall thereof.

Figure 3:
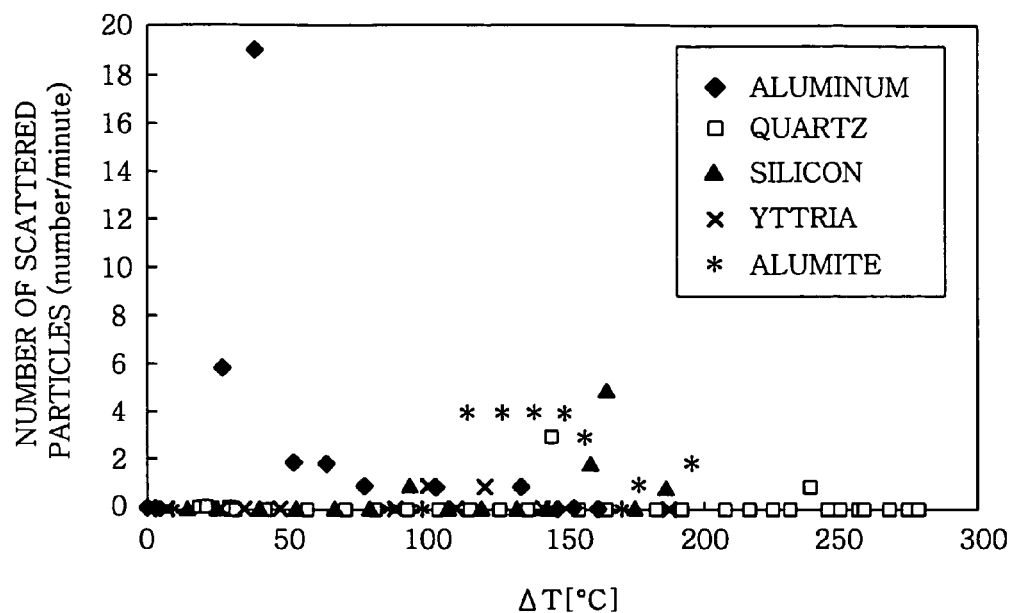
FIG. 3 sets forth a diagram showing a relationship between ΔT, which is a difference between the temperature of a predetermined gas introduced into the vacuum processing chamber and that of an inner wall of the vacuum processing chamber, and the number of particles scattered from the wafer into the space of the vacuum processing chamber.

In the dry etching device 1 shown in FIG. 1, the inner wall of the vacuum processing chamber 10 was made of aluminum. The inner pressure of the vacuum processing chamber 10 was maintained constant (about 5.0 Torr), and the temperature of the inner wall thereof was also maintained constant. In that stage, the temperature of the gas to be introduced into the vacuum processing chamber 10 was varied. Under the conditions described above, the number of particles scattered from the wafer 50 into the space of the vacuum processing chamber 10 was measured. In the same manner, measurements were performed in case where the inner wall material of the vacuum processing chamber 10 was quartz, silicon, yttria and alumite, respectively. The results are shown in FIG. 3.

From this, it can be noted that, in the case where the inner wall material of the vacuum processing chamber 10 is aluminum, a large number of particles can be peeled off therefrom when $\Delta T$ is controlled to be about 30° C.; and, in the case where the inner wall material of the vacuum processing chamber 10 is yttria, silicon or alumite, a large number of particles can be peeled off therefrom when $\Delta T$ is controlled to about 100° C.

In the following, there will be explained a relationship between the inner pressure of the vacuum processing chamber 10 and the number of particles scattered therein.

Figure 4:
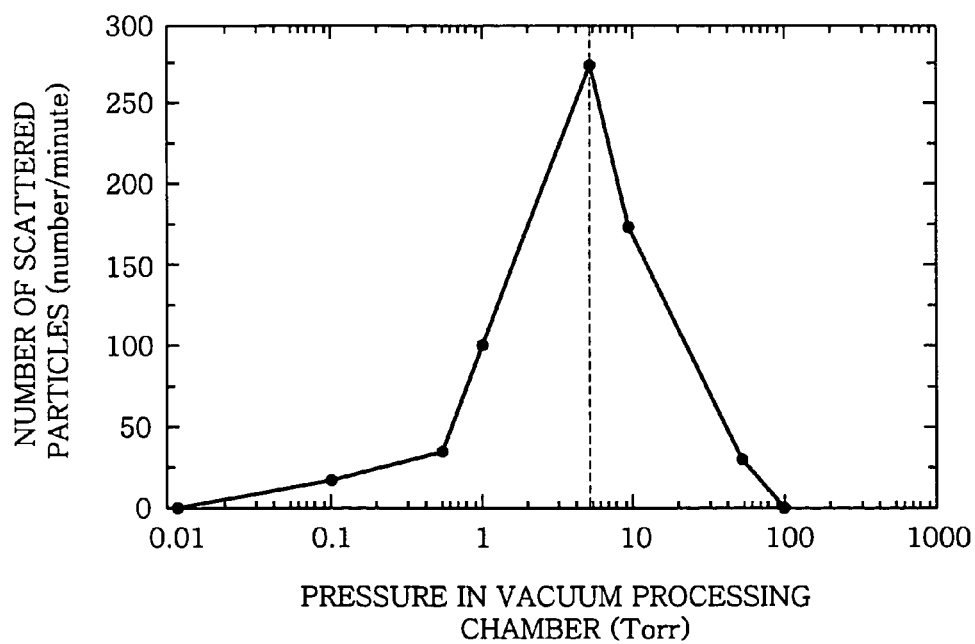
FIG. 4 describes a graph for showing a relationship between an inner pressure of the vacuum processing chamber of FIG. 1 and the number of particles scattered from the wafer into the space of the vacuum processing chamber.
Figure 5:
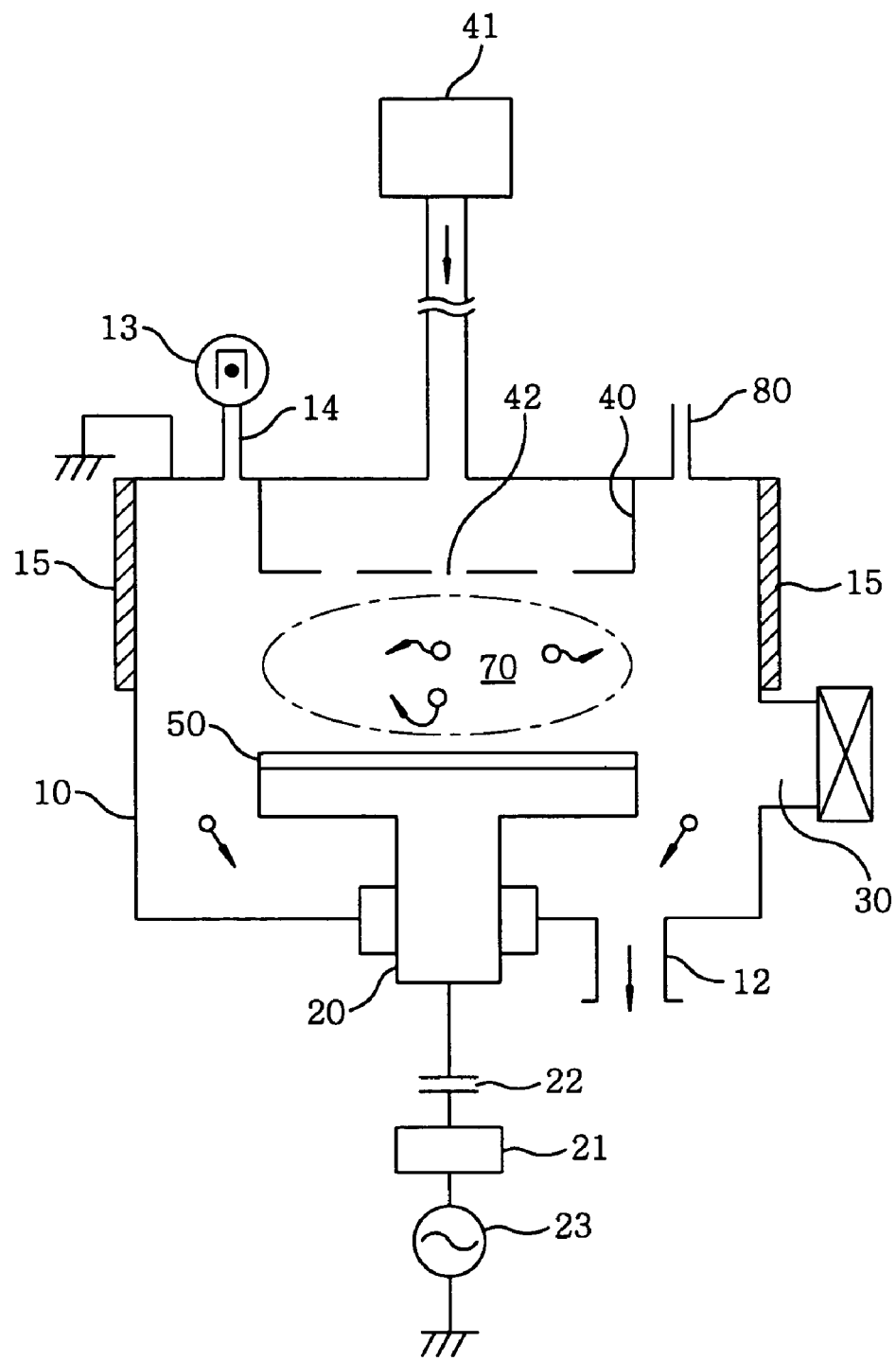
FIG. 5 is a cross sectional view showing a schematic configuration of a conventional processing apparatus.

In the dry etching device 1 shown in FIG. 1, the temperature of the lower electrode 20 (the temperature of the wafer 50) was maintained at 340° C., and the temperature of the upper electrode 40 was maintained at 50° C. And, while the inner pressure of the vacuum processing chamber 10 was varied in the range of 0.01~1000 Torr by the pressure control unit 90, the number of particles (numbers/minute) scattered from the wafer 50 into the space of the vacuum processing chamber 10 was measured. The results are shown in FIG. 4. From this, it can be noted that if the inner pressure of the vacuum processing chamber 10 is controlled in the range of 0.1~100 Torr (0.013~13 Pa), a large number of particles can be peeled off therefrom. It is preferable that the inner pressure of the vacuum processing chamber 10 is controlled in the range of 1.0~10 Torr (0.13~1.3 Pa) to peel off more particles therefrom. Namely, the particles generated in the vacuum processing chamber 10 can be more securely removed.

In accordance with the present embodiment, the temperatures of the inner wall of the vacuum processing chamber 10, the lower electrode 20 and the upper electrode 40 are detected by the temperature sensors 16, 24 and 44, respectively; and the temperature of the gas is controlled by the controller 91, based on any one of temperature gradients due to temperature differences between the inner wall and the gas, between the lower electrode 20 and the gas and between the upper electrode 40 and the gas. Accordingly, it is possible to remove the particles adhered to any one of the inner wall of the vacuum processing chamber 10, the lower electrode 20 and the upper electrode 40 by a thermophoretic force generated due to the temperature gradient and a thermal stress due to a difference in linear expansion coefficient; and, therefore, contamination of the wafer 50 due to the particles can be reduced.

In accordance with the present embodiment, since the inner wall of the vacuum processing chamber 10 is heated by the heating unit 15, the temperature gradient between the temperatures of the inner wall of the vacuum processing chamber 10 and a gas to be introduced into the inner space thereof can be controlled widely.

In accordance with the present embodiment, since the inner pressure of the vacuum processing chamber 10 is controlled by the pressure control unit 90, the particles produced in the vacuum processing chamber 10 can be further securely removed therefrom.

In accordance with the present embodiment, the lower electrode 20, disposed at the lower portion of the vacuum processing chamber 10, for mounting the object thereon to serve as a mounting table is maintained at a first temperature by the temperature control unit 23, and the upper electrode 40 disposed opposite to the lower electrode 20 in the vacuum processing chamber 10 is maintained at a second temperature by the temperature control unit 43. Thus, it is possible to widely control temperature differences between the lower and the upper electrode 20 and 40 and the gas to be introduced into the vacuum processing chamber 10.

In the present embodiment, the inner wall of the vacuum processing chamber 10 is made of aluminum, but not limited thereto. It may be made of yttria, alumite or the like. In this case, the temperature of the gas to be introduced into the vacuum processing chamber 10 is controlled to a temperature lower than that of the inner wall of the vacuum processing chamber 10 by 100° C. or more.

Further, the controller 91 can control the temperature of the gas to be introduced into the vacuum processing chamber 10, based on any one of the temperatures of the inner wall of the vacuum processing chamber 10, the lower electrode 20 and the upper electrode 40. Moreover, it may control the temperature of the gas to be introduced into the vacuum processing chamber 10 based on the lowest temperature of the temperatures of the inner wall of the vacuum processing chamber 10, the lower electrode 20 and the upper electrode 40.

Still further, the controller 91 may control the temperature of the gas based on the temperature gradients between the temperatures of the inner wall of the vacuum processing chamber 10 and the gas, between the temperatures of the lower electrode 20 and the gas or between the temperatures of the upper electrode 40 and the gas. In this way, it is possible to peel off particles adhered to the inner wall of the vacuum processing chamber 10, the lower electrode 20 or the upper electrode 40 by a thermophoretic force generated due to the temperature gradients and a thermal stress due to the difference in linear expansion coefficient, to thereby reduce the contamination of the wafer 50 due to the particles.

In the present embodiment, the dry etching device 1 includes the heating unit 15, such as a heat exchanger or the like, for heating the inner wall of the vacuum processing chamber 10, but not limited thereto. In case where the inner wall of the vacuum processing chamber 10 cannot be heated, the temperature adjusting unit 82 may be a peltier device, a heat pump, a heating coil heater or the like. In this case, by cooling down the temperature of the gas to be introduced into the vacuum processing chamber 10, it is possible to further securely generate the temperature gradient due to the temperature differences between the gas and the inner wall of the vacuum processing chamber 10, between the gas and the lower electrode 20 and between the gas and the upper electrode 40. At this time, the temperature adjusting unit 82 can be configured to perform the heat exchange with the gas with high efficiency.

Further, in the present embodiment, the dry etching device 1 includes the heating unit 15, such as a heater or the like, for heating the inner wall of the vacuum processing chamber 10. However, the present invention is not limited thereto. It may have a cooling unit for cooling the inner wall of the vacuum processing chamber 10. In this way, when the wafer 50 of the object to be processed is loaded into the vacuum processing chamber 10 or when a specific processing is performed on the wafer 50, the temperature gradient due to the temperature difference between the inner wall of the vacuum processing chamber 10 and the gas to be introduced thereinto may be kept from being generated. Thus, it is possible to suppress the particles produced in the vacuum processing chamber 10 from being peeled off therefrom. Moreover, the gas to be introduced into the vacuum processing chamber 10 may be heated by the temperature adjusting unit 82, so that the temperature gradient due to the temperature difference between the inner wall of the vacuum processing chamber 10 and the gas to be introduced thereinto is not generated, as well.

Further, in case when the wafer 50 of the object to be processed is loaded into the vacuum processing chamber 10 or a specific processing is performed on the wafer 50, the inner pressure of the vacuum processing chamber 10 may be controlled to a pressure lower than 0.1 Torr (0.013 Pa), or higher than 100 Torr (13 Pa), so that the particles produced in the vacuum processing chamber 10 is suppressed from being peeled off therefrom.

In the present embodiment, the controller 91 is independent of the pressure control unit 90, but not limited thereto. The controller 91 may be connected to the pressure control unit 90 to receive a signal from the pressure control unit 90, and control the temperature of the gas to be introduced into the vacuum processing chamber 10 based on the signal.

Further, in the present embodiment, the gas is introduced into the vacuum processing chamber 10 and the inside thereof is purged with the temperature controlled gas by evacuating the gas therefrom, before a specific processing is performed on the wafer 50. However, the present invention is not limited thereto. In case when the dry etching device 1 does not carry out the specific processing, i.e., in case when it is in an idle state, it is possible for the user to perform steps S21~S26 at a desired timing by using an input unit or the like (not shown) provided at the dry etching device 1.

Still further, in case when the dry etching device 1 is in idle state, steps S21~S26 may be performed by the dry etching device 1 at predetermined timings through a self-diagnosis function or the like. Moreover, steps S21~S26 may be performed at predetermined timings in response to external signals of a management system or the like (not shown) that manages plural dry etching devices 1. In this way, the inside of the vacuum processing chamber 10 can be kept clean.

In the present embodiment, the object to be processed is the wafer 50, but not limited thereto. It may be selected from the group consisting of a semiconductor substrate, a flat panel display (FPD) substrate and a liquid crystal display (LCD) substrate.

In the present embodiment, the processing apparatus is the dry etching device 1, but not limited thereto. It may be selected from the group consisting of a heat treatment unit, a film forming device and an ashing device.

EFFECTS OF THE INVENTION

In accordance with a processing apparatus and a method for removing particles therefrom, a first detection unit detects a temperature of an inner wall of a vacuum vessel; a second detection unit detects a temperature of a processing unit; and a first control unit controls a temperature of a gas based on a temperature gradient between temperatures of an inner wall and the gas or a temperature gradient between temperatures of a processing unit and the gas. Therefore, the particles adhered to the inner wall of the vacuum vessel or to the processing unit are peeled off therefrom by a thermophoretic force due to the temperature gradient and a thermal stress due to a difference in linear expansion coefficient, and thus contamination of an object to be processed due to the particles can be reduced.

Further, in accordance with the processing apparatus and the method, the first control unit controls the temperature of the gas to a temperature lower than at least one of the temperatures of the inner wall and the processing unit, by 30° C. or more. Therefore, the particles adhered to the inner wall of the vacuum vessel or to the processing unit can be securely peeled off therefrom by a thermophoretic force due to the temperature gradient.

Still further, in accordance with the processing apparatus and the method, the inner wall of the vacuum vessel is heated by a first heating unit, so that the temperature gradient between the temperatures of the inner wall of the vacuum vessel and a gas to be introduced into the inner space thereof can be controlled widely.

Still further, in accordance with the processing apparatus and the method, a first temperature control unit maintains the lower electrode at a first temperature, and a second temperature control unit maintains the upper electrode at a second temperature. Therefore, it is possible to widely control temperature gradients between the temperatures of the lower electrode and a gas to be introduced into the vacuum vessel, and between the temperatures of the upper electrode and the gas to be introduced thereinto.

Still further, in accordance with the processing apparatus and the method, a second control unit controls a pressure of the inner space of the vacuum vessel, so that the particles generated in the vacuum vessel can be more securely removed.

Still further, in accordance with the processing apparatus and the method, the second control unit controls the pressure of the inner space of the vacuum vessel in the range of 1.0~10 Torr (0.13~1.3 Pa), so that the particles generated in the vacuum vessel can be more securely removed.

Still further, in accordance with the method for removing particles from a processing apparatus, the gas is introduced in the inner space of the vacuum vessel before the object is processed by the processing unit, so that the particles adhered to the inner wall of the vacuum vessel can be peeled off therefrom by a thermophoretic force, which is generated due to the temperature gradient between the inner wall of the vacuum vessel and the temperature controlled gas, and thus contamination of an object to be processed due to the particles can be securely reduced.

While the invention has been shown and described with respect to the preferred embodiments, it will be understood by those skilled in the art that various changes and modifications may be made without departing from the spirit and scope of the invention as defined in the following claims.

What is claimed is:

1. A method for removing particles from a processing apparatus having a vacuum vessel whose inner space is evacuatable; a gas introduction unit for introducing a gas into the inner space of the vacuum vessel; and a processing unit, disposed in the inner space of the vacuum vessel, for processing an object therein, the method comprising:
a first detection step for detecting a temperature of an inner wall of the vacuum vessel;
a second detection step for detecting a temperature of the processing unit;
a first control step for controlling a temperature of the gas;
a gas introduction step for introducing the gas into the inner space of the vacuum vessel; and
a second control step for controlling a pressure of the inner space of the vacuum vessel,
wherein, in the first control step, the temperature of the gas is controlled based on a temperature gradient between the temperatures of the inner wall and the gas or a temperature gradient between the temperatures of the processing unit and the gas.

2. The method of claim 1, wherein, in the second control step, the pressure of the inner space of the vacuum vessel is controlled in the range of 1.0~10 Torr (0.13~1.3 Pa).

3. A method for removing particles from a processing apparatus having a vacuum vessel whose inner space is evacuatable; a gas introduction unit for introducing a gas into the inner space of the vacuum vessel; and a processing unit, disposed in the inner space of the vacuum vessel, for processing an object therein, the method comprising:
a first detection step for detecting a temperature of an inner wall of the vacuum vessel;
a second detection step for detecting a temperature of the processing unit;
a first control step for controlling a temperature of the gas;
a gas introduction step for introducing the gas into the inner space of the vacuum vessel;
a first temperature control step for maintaining the lower electrode at a first temperature; and
a second temperature control step for maintaining the upper electrode at a second temperature, wherein
in the first control step, the temperature of the gas is controlled based on a temperature gradient between the temperatures of the inner wall and the gas or a temperature gradient between the temperatures of the processing unit and the gas, and
the processing unit includes
a lower electrode, disposed at a lower portion of the vacuum vessel, for mounting thereon the object to serve as a mounting table, and
an upper electrode disposed opposite to the lower electrode in the vacuum vessel.

4. A processing apparatus having a vacuum vessel whose inner space is evacuatable; a gas introduction unit for introducing a gas into the inner space of the vacuum vessel; and a processing unit, disposed in the inner space of the vacuum vessel, for processing an object therein, the processing apparatus comprising:
a first detection unit for detecting a temperature of an inner wall of the vacuum vessel;
a second detection unit for detecting a temperature of the processing unit;
a first control unit for controlling a temperature of the gas; and
a second control unit for controlling a pressure of the inner space of the vacuum vessel,
wherein the first control unit controls the temperature of the gas based on a temperature gradient between the temperatures of the inner wall and the gas or a temperature gradient between the temperatures of the processing unit and the gas.

5. The processing apparatus of claim 4, wherein the pressure of the inner space of the vacuum vessel is controlled by the second control unit in the range of 1.0~10 Torr (0.13~1.3 Pa).

6. A processing apparatus having a vacuum vessel whose inner space is evacuatable; a gas introduction unit for introducing a gas into the inner space of the vacuum vessel; and a processing unit, disposed in the inner space of the vacuum vessel, for processing an object therein, the processing apparatus comprising:
- a first detection unit for detecting a temperature of an inner wall of the vacuum vessel;
- a second detection unit for detecting a temperature of the processing unit; and
- a first control unit for controlling a temperature of the gas, wherein the first control unit controls the temperature of the gas based on a temperature gradient between the temperatures of the inner wall and the gas or a temperature gradient between the temperatures of the processing unit and the gas, and the processing unit includes
- a lower electrode, disposed at a lower portion of the vacuum vessel, for mounting thereon the object to serve as a mounting table,
- an upper electrode disposed opposite to the lower electrode in the vacuum vessel,
- a first temperature control unit for maintaining the lower electrode at a first temperature, and
- a second temperature control unit for maintaining the upper electrode at a second temperature.

* * * * *